(12) United States Patent
Song et al.

(10) Patent No.: US 10,446,433 B2
(45) Date of Patent: Oct. 15, 2019

(54) SUPPORTER PIN AND HEAT TREATMENT APPARATUS HAVING THE SAME

(71) Applicants: LG DISPLAY CO., LTD., Seoul (KR); ZEUS CO., LTD., Gyeonggi-do (KR)

(72) Inventors: Jongho Song, Gyeonggi-do (KR); Minho Lee, Gyeonggi-do (KR)

(73) Assignees: LG Display Co., Ltd., Seoul (KR); Zeus Co., Ltd., Gyeonggi-do (KR)

( * ) Notice: Subject to any disclaimer, the term of this patent is extended or adjusted under 35 U.S.C. 154(b) by 53 days.

(21) Appl. No.: 15/220,774

(22) Filed: Jul. 27, 2016

(65) Prior Publication Data

US 2017/0032998 A1 Feb. 2, 2017

(30) Foreign Application Priority Data

Jul. 30, 2015 (KR) .......................... 10-2015-0107930

(51) Int. Cl.
*H01L 21/67* (2006.01)
*H01L 21/687* (2006.01)

(52) U.S. Cl.
CPC ................................ *H01L 21/6875* (2013.01)

(58) Field of Classification Search
CPC ............... H01L 21/67; H01L 21/67309; H01L 21/6734; H01L 21/68742; H01L 21/6875; F27D 3/0084; G02B 27/644; F16C 29/064; F16C 29/0642; F16C 29/046; F16C 29/0669
See application file for complete search history.

(56) References Cited

U.S. PATENT DOCUMENTS

| | | | | |
|---|---|---|---|---|
| 5,516,211 A | * | 5/1996 | Barnes | B65G 39/025 |
| | | | | 193/35 MD |
| 5,673,780 A | * | 10/1997 | Bildsoe | B65G 13/10 |
| | | | | 108/55.3 |
| 7,204,887 B2 | * | 4/2007 | Kawamura | H01L 21/67309 |
| | | | | 118/724 |
| 7,338,353 B2 | * | 3/2008 | Lee | B24B 37/345 |
| | | | | 451/11 |
| 7,393,207 B2 | * | 7/2008 | Imai | H01L 21/324 |
| | | | | 118/728 |
| 7,445,387 B2 | * | 11/2008 | Iguchi | F16O 29/002 |
| | | | | 193/35 A |
| 8,011,307 B2 | * | 9/2011 | Marcelli | B65G 39/025 |
| | | | | 108/55.3 |
| 8,635,960 B2 | * | 1/2014 | Iguchi | F16O 29/046 |
| | | | | 108/139 |
| 9,284,128 B2 | * | 3/2016 | Stegmiller | B65G 13/00 |
| 9,371,584 B2 | * | 6/2016 | Kim | C23C 16/458 |
| 9,809,491 B2 | * | 11/2017 | Sun | C03C 17/32 |

(Continued)

FOREIGN PATENT DOCUMENTS

KR 20130122441 A 11/2013
KR 101494842 B1 3/2015

*Primary Examiner* — Gregory A Wilson
(74) *Attorney, Agent, or Firm* — Morgan, Lewis & Bockius LLP

(57) ABSTRACT

A supporter pin and a heat treatment apparatus are provided in which a substrate subject to heat treatment may be supported while preventing itself from damaging the substrate. The supporter pin includes a housing in which a groove is formed; a ball accommodated in the groove and supporting the substrate; and a retainer accommodated in the housing and preventing separation of the ball.

14 Claims, 8 Drawing Sheets

(56) References Cited

U.S. PATENT DOCUMENTS

| 2003/0072639 A1* | 4/2003 | White | H01L 21/67309 |
| | | | 414/217 |
| 2016/0154252 A1* | 6/2016 | Miller | G02B 7/09 |
| | | | 359/557 |
| 2016/0172220 A1* | 6/2016 | Pan | H01L 21/67115 |
| | | | 118/725 |

* cited by examiner

SUPPORTER PIN AND HEAT TREATMENT APPARATUS HAVING THE SAME

This application claims the priority benefit of Korean Patent Application No. 10-2015-0107930 filed on Jul. 30, 2015, which is incorporated herein by reference for all purposes as if fully set forth herein.

BACKGROUND OF THE INVENTION

Field of the Invention

The present disclosure relates to a heat treatment apparatus, and more particularly, to a supporter pin supporting a substrate subject to heat treatment and preventing itself from damaging the substrate, and a heat treatment apparatus having the same.

Discussion of the Related Art

Generally, a heat treatment process is performed to manufacture various types of electronic devices, such as a semiconductor, a display, and a solar battery. The heat treatment process is essential for phase change, such as crystallization, hardening, and baking, of a thin film which is deposited on a silicon wafer, glass, or plastic substrate. The heat treatment process is performed on a substrate that is mounted in a heat treatment apparatus having a heating unit and a supporter pin.

The heat treatment apparatus may support a substrate in one of three type structures: a boat-type structure, a setter-type structure, and a pin-type structure. The boat-type structure is a structure in which a plurality of substrates is stacked on a boat sequentially. The boat-type structure may minimize the contact between the substrate and the boat, but, if a large-size glass substrate is used, the substrate may sag. The setter-type structure is a structure in which a substrate is put on a thin quartz plate, so called a setter, so the substrate is in an area contact with the setter. The setter-type structure is used for a 600° C. or higher temperature process. However, a setter equipment is expensive and fragile so it is difficult to handle. The pin-type structure is a structure in which a substrate is in point contact with a ball put on a pin-type bar, and this structure is used for a mid or low temperature process.

FIG. 1 is a diagram illustrating a heat treatment apparatus having a pin-type supporter pin, and FIG. 2 is a diagram illustrating a supporter pin.

With reference to FIGS. 1 and 2, a heat treatment apparatus 5 includes a chamber 10 in which a plurality of heaters 20, a plurality of supporter pins 30, and a substrate 40 are disposed. The plurality of heaters 20 and the plurality of supporter pins 30 are disposed to correspond to each other, and the substrate 40 sits on the supporter pins 30. The supporter pin 30 includes a housing 31 that accommodates an external ball 33 and an internal ball 32. The housing 31 has a groove in which the external ball 33 and the internal ball 32 are accommodated. When the external ball 33 rotates, the internal ball 32 simultaneously rotates to make the external ball 33 rotate smoothly. The external ball 33 is in contact directly with the substrate 40, and prevents the external ball 33 from scratching the substrate when the external ball 33 rotates.

However, the aforementioned supporter pin may be thermally deformed by a Steel Use Stainless (SUS) housing during a high-temperature heat treatment process. The thermally distorted housing is curled up inwardly at a portion surrounding the external ball, and thus, interference with the external ball occurs. Therefore, when the substrate in contact with the external ball moves, the housing stops the external ball from rotating and the substrate is scratched.

SUMMARY

The present invention relates to a supporter pin and a heat treatment apparatus having the same that substantially obviate one or more of the problems due to limitations and disadvantages of the related art.

An object of the present invention is to provide a thin-film transistor substrate that can improve the characteristics of thin-film transistors and a display device comprising the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a supporter pin comprises a housing in which a groove is formed, a ball accommodated in the groove and supporting a substrate, and a retainer accommodated in the housing and preventing separation of the ball.

In another aspect, a heat treatment apparatus comprises a chamber, a body unit disposed in an inner space of the chamber, a boat disposed in an inner space of the body unit, a substrate disposed to oppose the boat, a supporter pin disposed on the boat and supporting the substrate, and a heater unit disposed to oppose the substrate, wherein the supporter pin includes a housing in which a groove is formed, a ball accommodated in the groove to support the substrate, and a retainer accommodated in the housing and preventing separation of the ball.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
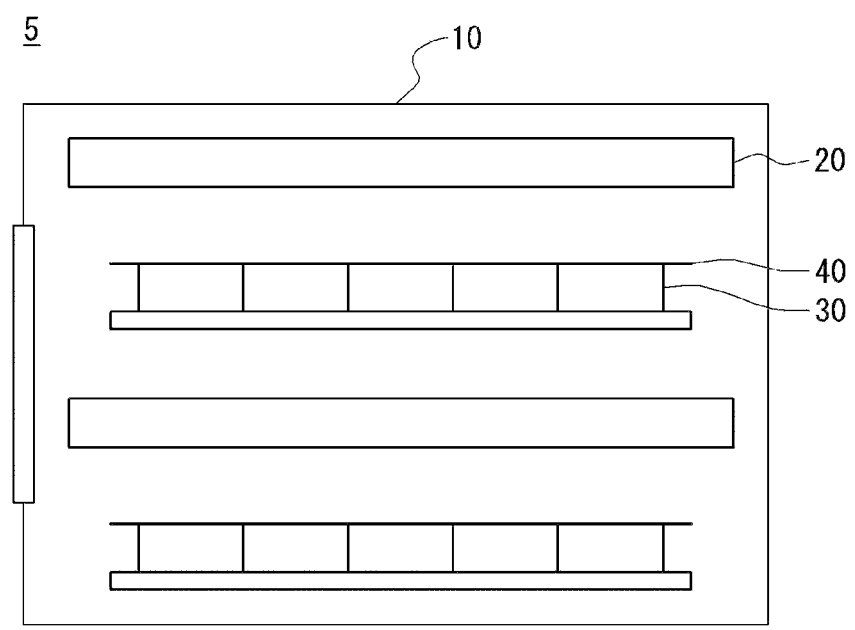
FIG. 1 is a diagram illustrating a heat treatment apparatus having a pin-type supporter pin.
Figure 2:
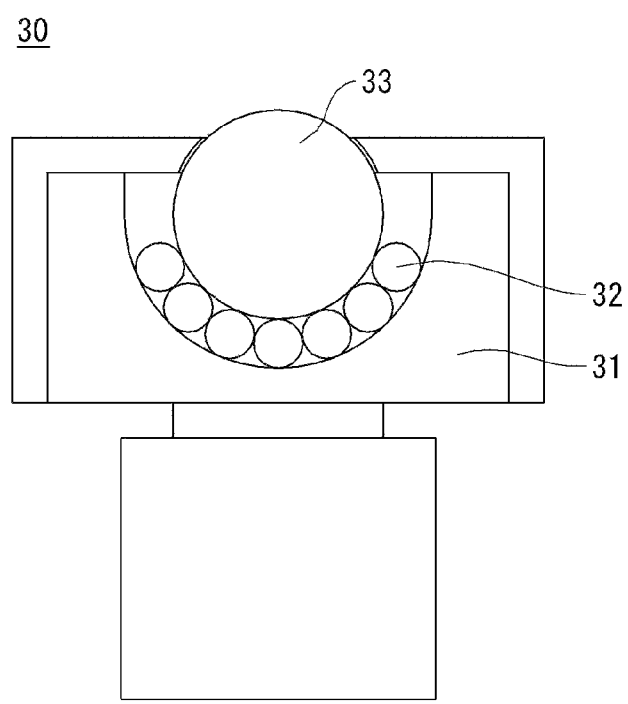
FIG. 2 is a diagram illustrating a supporter pin.

Throughout the specification, the same reference numeral is used to indicate substantially identical elements. Hereinafter, descriptions of well-known functions and constructions may be omitted for increased clarity and conciseness. In addition, the terminology used herein is for the purpose of describing particular embodiments only and is not intended to be limiting of the present disclosure.

Hereinafter, embodiments of the present disclosure are described with reference to accompanying drawings.

A method of manufacturing an electronic device according to an embodiment of the present disclosure may be used for electronic devices, such as a semi-conductor device, a Liquid Crystal Display (LCD), an Organic Light Emitting Diode (OLED), an electrophoresis device (EPD), and a solar cells. Embodiments of the present disclosure are described by taking an example of the LCD out of the aforementioned electronic devices.

A method of manufacturing an LCD according to an embodiment of the present disclosure includes a substrate cleaning process, a substrate patterning process, an alignment layer forming/rubbing process, and a substrate assembling and Liquid Crystal (LC) dropping process.

The substrate cleaning process is to remove polluted materials from upper and lower glass substrates of the liquid crystal panel with cleansing solution. The substrate patterning process includes a process of forming and patterning signal lines, including data lines and gate lines, and various thin film materials, a Thin Film Transistor (TFT), a pixel electrode, and a common electrode, on the lower glass substrate of the LCD, and a process of forming and patterning various thin film materials, including a black matrix and a color filter, on the upper glass substrate of the LCD.

More specifically, the TFT includes a semiconductor layer, a gate electrode, a source electrode, and a drain electrode. The semiconductor layer is a layer formed of semiconductor materials, and it may be formed of amorphous silicon (a-Si), polycrystalline silicon (poly-Si), or an oxide semiconductor. A method of manufacturing an LCD having a TFT whose semiconductor layer is formed of polycrystalline silicon is described as below. Amorphous silicon is deposited on a glass substrate, and the glass substrate is put inside a heat treatment apparatus to go through high-temperature heat treatment. Having gone through the high-temperature heat treatment, the amorphous silicon is crystallized into poly crystalline silicon. The poly crystalline silicon is patterned by photolithography method in a predetermined shape to form a semiconductor layer.

The alignment layer forming/rubbing process is to coat an alignment layer on glass substrates and then rub or photo-align the alignment layer with a rubbing cloth. After this process is done, data lines supplied with a video data voltage, gate lines crossing the data lines and sequentially supplied with scan signals, that is, gate pulses, TFTs each formed at an intersection of a data line and a gate line, a liquid crystal cell's pixel electrodes each connected to a different TFT, a pixel including a storage capacitor, and a TFT array are formed on a lower glass substrate of the LCD. A shift register of a gate driving circuit, which generates a scan signal, may be formed simultaneously with the pixel and the TFT array in the substrate patterning process.

A black matrix, a color filter, and a common electrode are formed on an upper glass substrate of the LCD. The common electrode is formed on the upper glass substrate in a vertical field driven method, such as a Twisted Nematic (TN) mode and a Vertical Alignment (VA) mode, and formed on the lower glass substrate along with the pixel electrode in a horizontal field driven method, such as an In Plane Switching (IPS) mode and a Fringe Field Switching (FFS) mode. A polarizer is attached on each of the upper and lower glass substrates, and a polarizer protective film is attached on the polarizing plate.

A substrate assembling and liquid crystal dropping process is to draw the sealant in any one of the upper and lower glass substrates of the Liquid crystal panel and drop liquid crystal on the other substrate. After the upper and the lower glass substrates are arranged, a vacuum pump is driven to put pressure on any one of the upper and the lower glass substrates in a vacuum state so that the upper and lower glass substrates may bond with each other. Then, an ultraviolet (UV) light source is turned on to irradiate UV light onto the sealant through the upper glass substrate and thereby harden the sealant. By doing so, the LCD manufacturing process is completely finished.

A heat treatment apparatus provided in the following embodiments of the present disclosure may be applied not only to a method of manufacturing an LCD, such as a process of crystallizing a semiconductor layer, but also to a heat treatment processes for various electronic devices, such as a polyimide flexible substrate and an oxide semiconductor. In addition, a supporter pin according to an embodiment of the present disclosure may be applied not only to a heat treatment apparatus, but also to any device or apparatus in which a substrate rests.

Figure 3:
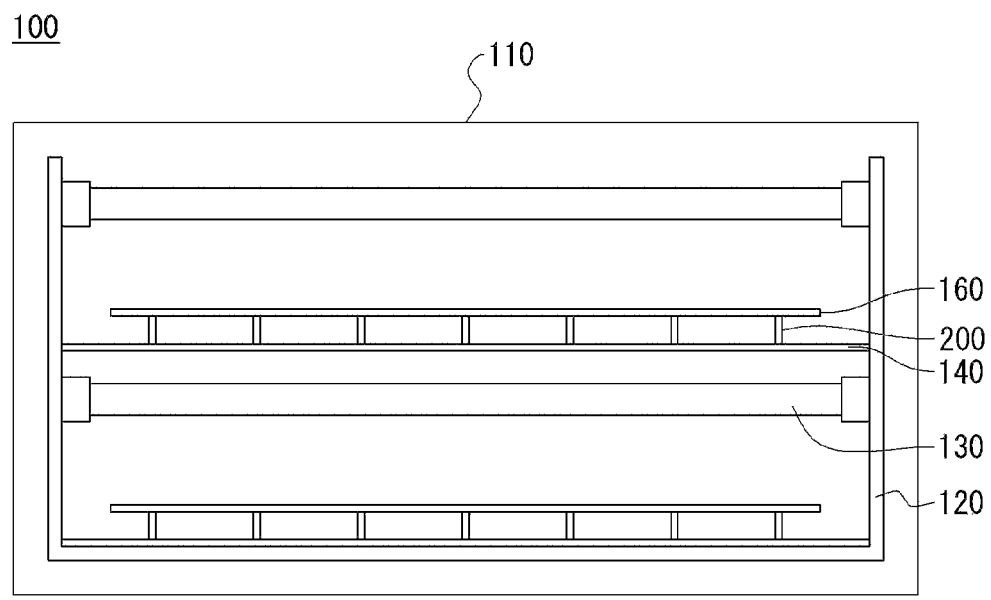
FIG. 3 is a diagram illustrating a heat treatment apparatus according to an embodiment of the present disclosure.
Figure 4:
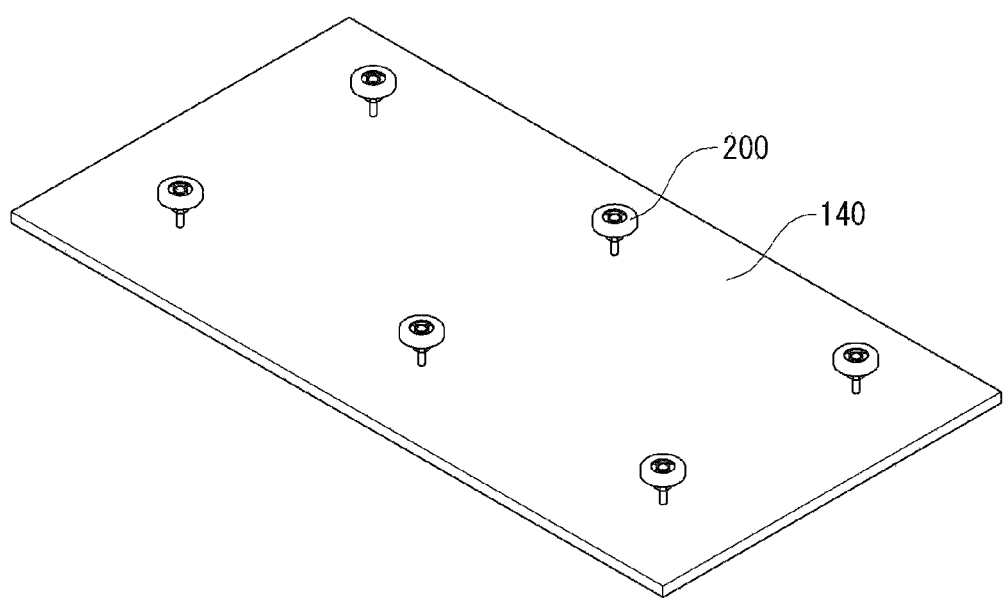
FIG. 4 is a boat and a supporter pin of a heat treatment apparatus.

FIG. 3 is a diagram illustrating a heat treatment apparatus according to an embodiment of the present disclosure, and FIG. 4 is a diagram illustrating a boat and a supporter pin of a heat treatment apparatus.

With reference to FIG. 3, a heat treatment apparatus 100 according to an embodiment of the present disclosure includes a chamber 110, a body unit installed in an inner space of the chamber 110, a boat 140 installed in the body unit 120 to let a substrate 160 rest thereon, the substrate which is injected in one direction in the inner space of the chamber 110, and a heater unit 130 installed in the body unit 120 to oppose the boat 140 in the inner space of the chamber 110.

The boat 140 is an element on which the substrate 160 rests, and may be formed of a transparent material for the purpose of radiation transfer of heat generated in the heat unit 130. The boat 140 may be disposed in an inner space of the body unit 120 in a manner that each end portion of the boat 140 is fixed onto a wall of the body unit 120 or that the boat 140 is supported by the heater unit 130.

The boat 140 may include a supporter pin 200 which protrudes in a longitudinal direction of the substrate 160, that is, a direction opposite to gravity. If a plurality of supporter pins 200 is provided, the substrate 160 may be in point contact with the supporter pins 200 to thereby rest on the boat 140.

In a case where the body of the boat 140 is in a plate shape, if the substrate 160 rests directly on the boat 140, the substrate 160 may be in area contact with the boat 140. In this case, the substrate 160 may receive radiant heat of heat generated in the heater unit 130, but it is difficult to receive conductive heat through reaction gas included in the inner space of the chamber 100. However, the substrate 160 is spaced apart from the body of the boat 140 by the supporter pins 200, so it is possible to highly reliably transfer the conductive heat caused by the heater unit 130 to the substrate 160.

The heater unit 130 may include a plurality of near infrared lamp heaters. A near infrared lamp heater may emit near infrared light with an approximate wavelength band of between 1 µm to 5 µm, the light which is suitable for heating a silicon-type substrate 160 or a film (e.g., a polyimide film) coated on the substrate 160 to dry or bake the silicon-type substrate 160 or the film. Output power of the plurality of near infrared lamp heaters may be controlled on a heater unit basis or on a group unit basis. By controlling the output power of the plurality of near infrared lamp heaters on a heater unit basis or on a group unit basis, it is possible to control temperature uniformity of the substrate 160.

Meanwhile, with reference to FIG. 4, a plurality of supporter pins according to the present disclosure is arranged on the boat 140. The supporter pins 200 are arranged at a predetermined interval to prevent the substrate 160 from sagging, and it is not necessary to arrange too many supporter pins 200. In addition, the supporter pins 200 need to support the substrate 160 and should not damage the substrate 160 when the substrate 160 moves minutely. Therefore, the supporter pins 200 according to an embodiment of the present disclosure may be configured as described below.

Figure 5:
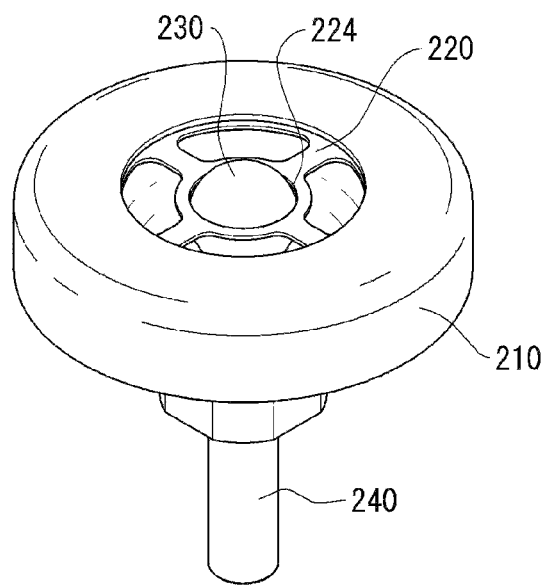
FIG. 5 is a perspective view of a supporter pin according to an embodiment of the present disclosure.
Figure 6:
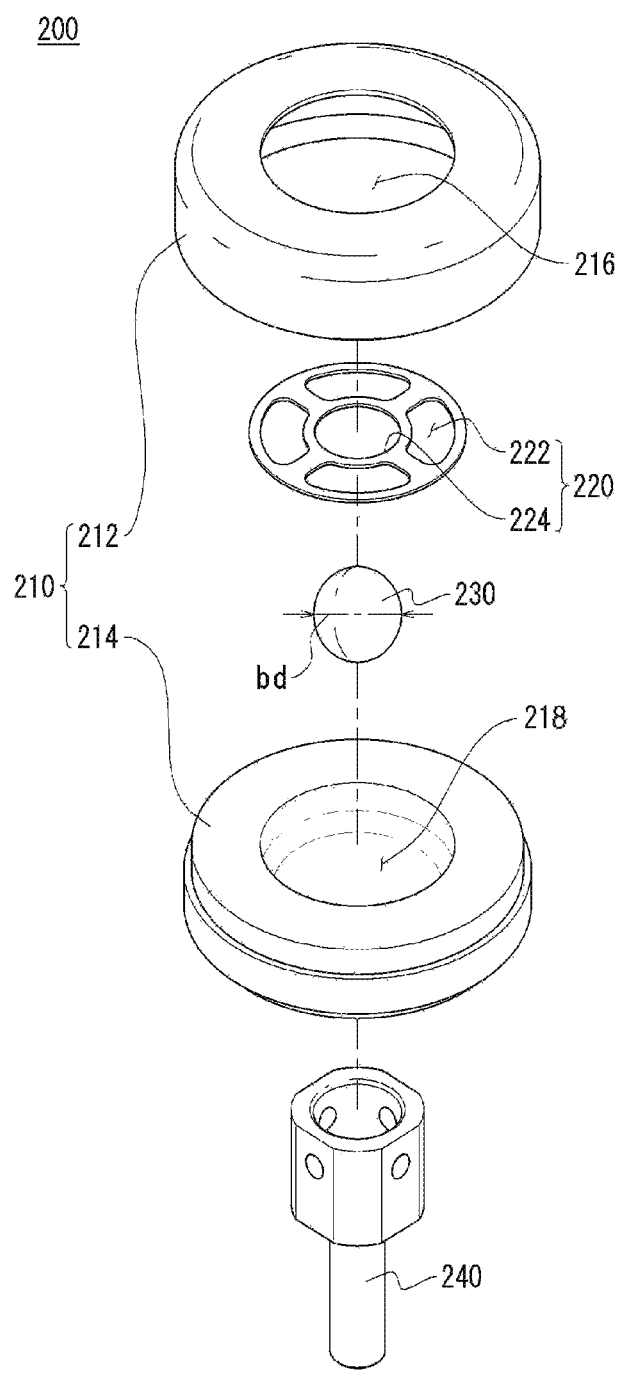
FIG. 6 is a exploded perspective view of a supporter pin according to an embodiment of the present disclosure.

FIG. 5 is a perspective view of a supporter pin according to an embodiment of the present disclosure, and FIG. 6 is an exploded perspective view of a supporter pin according to an embodiment of the present disclosure.

With reference to FIGS. 5 and 6, a supporter pin 200 according to an embodiment of the present disclosure includes a cylindrical housing 210, a ball 230 installed in an inner space of the housing 210 to support a substrate, a retainer 220 preventing the ball 230 from separating from the inner space of the housing 210, and a connection part 240 securing the housing 210 to a boat (not shown).

The housing 210 defines the body of the supporter pin 200, and is made of Steel Use Stainless (SUS) which has a high heat resistant property and great rigidity. The housing 210 includes an upper housing 212 and a lower housing 214 to accommodate the ball 230 of the supporter pin 200 and the retainer 220. The upper housing 212 has an open bottom surface to be secured to the lower housing 214, and a housing hall 216 to allow the ball 230 to protrude from the top of the upper housing 212. The lower housing 214 has an open bottom surface to be secured to the upper housing 21, and a groove 218 in which the ball 230 is accommodated. The groove 218 of the lower housing 214 is a space in which the ball 230 is accommodated and able to move. The groove 218 has a predetermined width and a predetermined depth to enable the ball 230 to move.

The ball 230 of the supporter pin 200 is accommodated within the groove 218 of the housing 210. The ball 230 supports a substrate, and may be made of metal, metal alloy, ceramics, and the like to withstand the weight of the substrate and support the substrate. In an embodiment of the present disclosure, the ball 230 may be made of zirconia. In addition, to minimize damage to the substrate when the substrate moves, the ball 230 may have a smooth surface and the surface of the ball 230 may be further coated. The ball 230 may be globe-shaped or almost globe-shape, so it is able to freely move in the groove 218 of the housing 210. In addition, the ball 230 has a predetermined diameter to withstand the weight of the substrate. The diameter db of the ball 230 may be between 5 mm and 10 mm. If the diameter bd of the ball 230 is equal to or greater than 5 mm, the reliability of withstanding the weight of the substrate may improve. If the diameter bd of the ball 230 is equal to or smaller than 10 mm, the ball 230 may be reduced in weight and thus the supporter pin 200 may become lighter.

The retainer 220 of the supporter pin 200 is accommodated in the upper housing 212 and the lower housing 214 to prevent separation of the ball 230. The retainer 220 is in a circle plate shape to correspond to the housing hall 216 of the upper housing 212. In addition, when the ball 230 moves, the retainer 220 and the ball 230 contact each other and thereby friction occurs. For this reason, the retainer 220 is made of metal, metal alloy, ceramics, and the like, which has less friction with the ball 230 and is light in weight. In an embodiment of the present disclosure, the retainer 220 may be made of aluminum (Al).

The retainer 220 includes a ball hole 224 to allow the ball 230 to protrude from the top of the retainer 220. In addition, the retainer 220 may or may not further include a retainer hole 222 in surroundings of the ball hole 224. In the case where the retainer 220 includes the retainer hole 222, at least one retainer hole 222 may be provided for the purpose of light weight of the retainer 220. In an embodiment of the present disclosure, the retainer 220 including four retainer hole 222 is shown and described. However, the number of retainer holes 222 is not limited thereto. That is, many retainer holes 222 may be provided to occupy the area of the retainer 220 as long as rigidity of the retainer 220 is sufficient.

The connection part 240 of the supporter pin 200 is secured to the housing 210 to secure the supporter pin 200 to the boat (not shown). The connection part 240 is made of SUS which has a high heat resistant property to tolerate high temperature.

Therefore, the supporter pin 200 according to an embodiment of the present disclosure includes the housing 210, the retainer 220, the ball 230, and the connection part 240. Hereinafter, detailed features of the supporter pin 200 are described with cross-sectional views and plain views.

Figure 7:
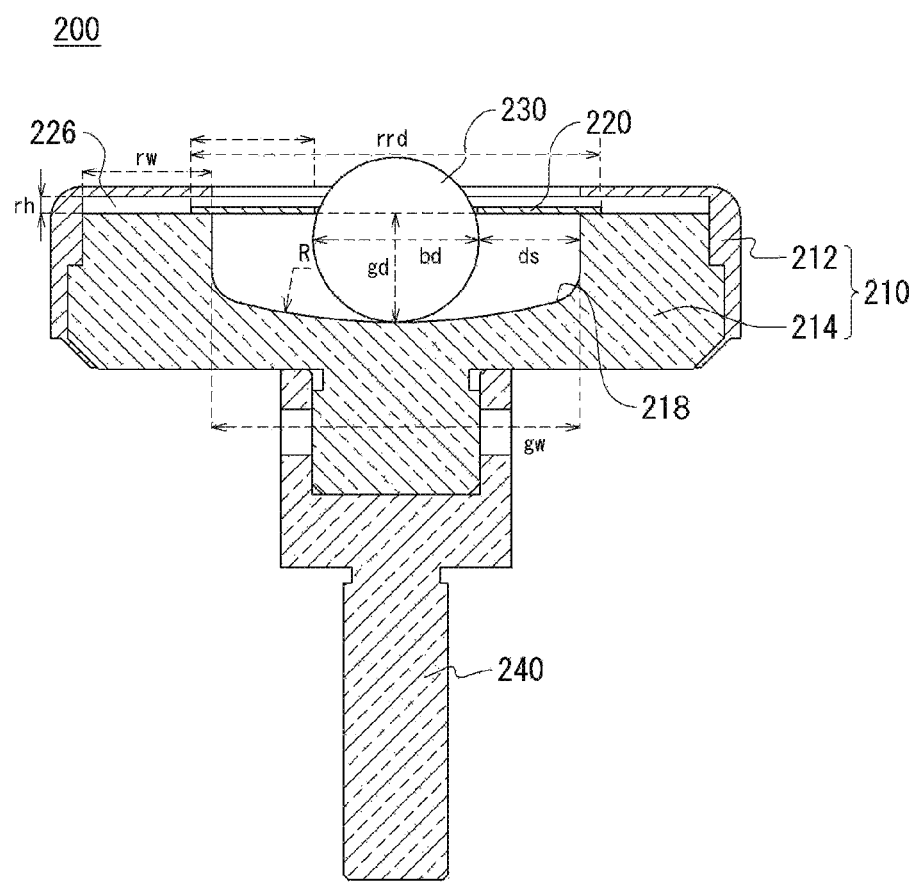
FIG. 7 is a cross-sectional view of a supporter pin according to an embodiment of the present disclosure.
Figure 8:
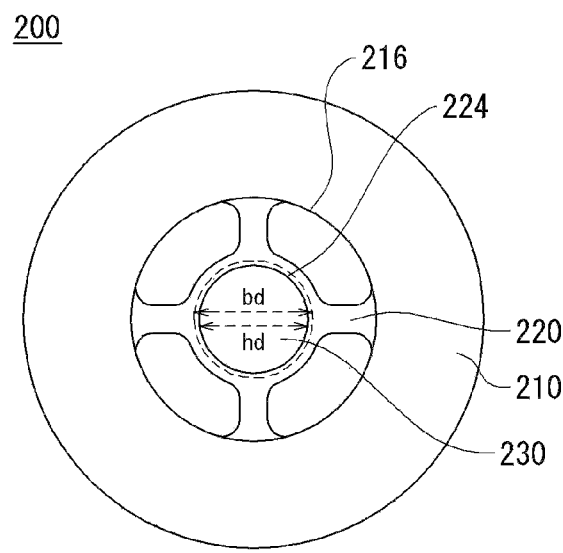
FIGS. 8 and 9 are plain views of a supporter pin according to an embodiment of the present disclosure.
Figure 9:
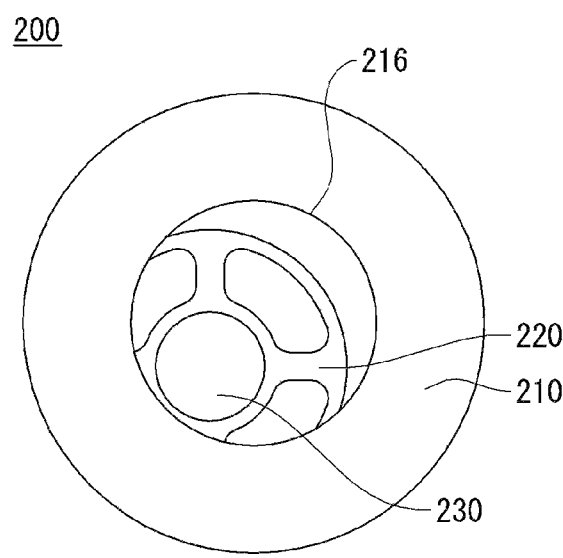
Figure 10:
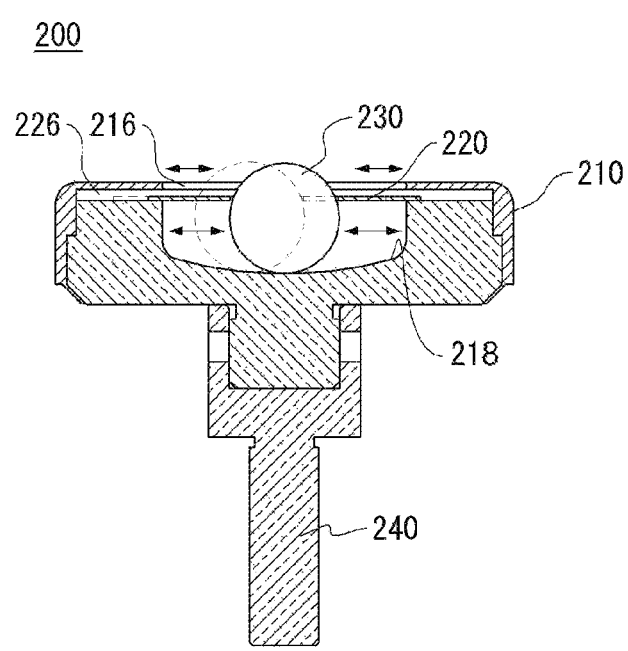
FIG. 10 is a cross-sectional view for explaining how a ball of a supporter pin according to an embodiment of the present disclosure moves.

FIG. 7 is a cross-sectional view of a supporter pin according to an embodiment of the present disclosure, FIGS. 8 and 9 are plain views taken from the top of a supporter pin according to an embodiment of the present disclosure, and FIG. 10 is a cross-sectional view for explaining how a ball of a supporter pin according to an embodiment of the present disclosure moves.

With reference to FIG. 7, a supporter pin 200 according to an embodiment of the present disclosure is configured such that a ball 230 and a retainer 220 are accommodated in a housing 210 which is a combination of an upper housing 212 and a lower housing 214, and that the housing 210 and a connection part 240 are secured.

A groove 218 of the lower housing 214 has predetermined depth gd and predetermined width gw. The depth gd of the groove 218 is smaller than diameter bd of the ball 230 so that the ball 230 is able to move in the groove 218 and protrude externally from the housing 210. The width gw of the groove 218 is wide enough to enable the ball 230 to move in the groove 218 in any direction. That is, the width gw of the groove 218 is a sum of the diameter bd of the ball 230, a distance up to which a substrate is capable of moving in one direction, and a distance up to which the substrate is capable of moving in the other direction. The distance up to which the substrate is capable of moving in one direction is indicated as distance ds between a side surface of the ball 230 and a side surface of the groove 218. For example, if the substrate moves up to 2 mm and the diameter bd of the ball 230 is 6 mm, the width gw of the groove 218 may be approximately 10 mm.

The upper housing 212 and the lower housing 214 are secured to form a retainer accommodator 226 in which the retainer 220 is able to be accommodated. The retainer accommodator 226 is a space in which the retainer 220 is accommodated to move along with the ball 230 when the ball 230 moves. The retainer 220 has length rrd greater than the width of the groove 218 of the lower housing 214 not to be separate from the retainer accommodator 226 due to movement of the ball 230. The retainer accommodator 226 has predetermined height rh and predetermined width rw. The height rh of the retainer accommodator 226 needs to be high enough not to contact the retainer 220 or the ball 230 when the end portion of the upper housing 212 is curled up toward the ball 230 in a high-temperature heat treatment process. In addition, the height rh of the retainer accommodator 226 needs high enough to prevent the ball 230 from moving upward to a predetermined level along with the retainer 220 when the ball 230 has moved to one side of the groove 218. Therefore, the height rh of the retainer accommodator 226 is between 0.6 mm and 1.1 mm. The width rw of the retainer accommodator 226 needs to be wide enough to allow one side of the retainer 220 to be accommodated in the retainer accommodator 226. Therefore, the weight rw of the retainer accommodator 226 should be equal to or greater than distance rd from one side surface of the ball hole 224 of the retainer 220 to the most outer side surface of the retainer 220.

Meanwhile, the groove 218 may have a bottom surface with a predetermined radius of curvature to make the ball 230 to return to the center of the groove 218. The radius of curvature R for the bottom surface of the groove 218 is between 15 mm and 60 mm. In a case where the radius of curvature R is equal to or greater than 15 mm, if the ball 230 has moved to one side of the groove 218, the retainer 220 and the ball 230 move upward together. However, because of the limited height rh of the retainer accommodator 226, the retainer 220 is not able to move upward, and thus, the ball 230 is also not able to move upward. Therefore, the radius of curvature R for the bottom surface of the groove 218 needs to be equal to or greater than 15 mm not to interfere with movement of the ball 230 and the retainer 220 even when the ball 230 has moved to one side of the groove 218. In a case where the radius of curvature R for the bottom surface of the groove 218 is equal to or smaller than 60 mm, the bottom surface of the groove 218 is at a great inclined angle, so the ball 230 is able to easily return to its original location.

Meanwhile, with reference to FIGS. 8 and 10, to prevent separation of the ball 230, the ball hole 224 of the retainer 220 has diameter hd smaller than diameter bd of the ball 230. At this point, if the ball 230 is located at the center of the groove 218, the retainer 220 is not in contact with the ball 230. If the ball 230 moves, one side of the ball hole 224 located in the moving direction of the ball 230 is in contact with the ball 230. In addition, if the ball 230 moves, one side of the retainer 220 moves into the retainer accommodator 266 and the other side thereof is free of the retainer accommodator 226 to move along with the ball 230. At this point, the retainer 220 is not separated from the retainer accommodator 226 because the retainer 220 and the housing hole 216 of the upper housing are circular shaped and the retainer 220 has a diameter greater than that of the housing hole 216.

The aforementioned heat treatment apparatus having a supporter pin may be able to perform heat treatment on a substrate for which heat treatment is required in the process of manufacturing an electronic device. More specifically, a substrate for which heat treatment moves into a housing of a chamber to sit on supporter pins provided in a boat. A heater unit emits near infrared light to perform heat treatment on the substrate. If the substrate moves in the heat treatment process, a ball and a retainer of each supporter pin move along with the substrate in a groove of the housing in order to prevent damage to the substrate. Having gone through the heat treatment process, the substrate is ejected from the heat treatment apparatus to finish the heat treatment process.

As described above, the supporter pin according to an embodiment of the present disclosure includes a housing having a groove in which a ball is accommodated, and a retainer which is accommodated in the housing to prevent separation of the ball. With the supporter pin configured as above, the ball is able to move although the housing is distorted due to high-temperature heat treatment. Thus, it is possible to prevent damage to a substrate.

Therefore, the heat treatment apparatus according to an embodiment of the present disclosure includes the aforementioned supporter pin and thus is able to prevent damage to a substrate which may occur when the substrate rests in the heat treatment apparatus or when the substrate moves during a heat treatment process.

It will be apparent to those skilled in the art that various modifications and variations can be made in the supporter pin and the heat treatment apparatus having the same of the present invention without departing from the spirit or scope of the invention. Thus, it is intended that the present invention cover the modifications and variations of this invention provided they come within the scope of the appended claims and their equivalents.

What is claimed is:

1. A supporter pin, comprising:
   a housing in which a groove is formed;
   a ball accommodated in the groove and supporting a substrate; and
   a retainer accommodated in the housing and preventing separation of the ball,
   wherein the housing provides a space for the retainer to move along with the ball, such that the retainer moves upward and to one side in the space when the ball moves to the one side of the groove,
   wherein the ball directly contacts a bottom surface of the groove.

2. The supporter pin of claim 1, wherein the groove has the bottom surface with a predetermined radius of curvature so that the ball is located at the center of the groove.

3. The supporter pin of claim 2, wherein the radius of curvature for the bottom surface of the groove is between 15 mm and 60 mm.

4. The supporter pin of claim 1, wherein a depth of the groove is smaller than a diameter of the ball.

5. The supporter pin of claim 1, wherein the housing comprises an upper housing and a lower housing, and the upper housing and the lower housing are secured to form a retainer accommodator in which the retainer is accommodated.

6. The supporter pin of claim 5, wherein a height of the retainer accommodator is between 0.6 mm and 1.1 mm.

7. The supporter pin of claim 5, wherein a diameter of the retainer accommodator is greater than a diameter of the retainer to provide the space for the retainer to move along with the ball.

8. The supporter pin of claim 5, wherein, when the ball moves, one side of the retainer moves into the retainer accommodator and the other side thereof is free of the retainer accommodator to move along with the ball.

9. The supporter pin of claim 1, wherein a diameter of a ball hole of the retainer is smaller than a diameter of the ball.

10. The supporter pin of claim 1, wherein the retainer has at least one retainer hole in surroundings of a ball hole of the retainer.

11. The supporter pin of claim 1, wherein a length of the retainer is greater than a width of the groove.

12. The supporter pin of claim 1, wherein the space provided by the housing has a width greater than a width of the retainer and a height greater than a height of the retainer such that the retainer can move within the space.

13. A heat treatment apparatus, comprising:
a chamber;
a body unit disposed in an inner space of the chamber;
a boat disposed in an inner space of the body unit;
a substrate disposed to oppose the boat;
a supporter pin disposed on the boat and supporting the substrate; and
a heater unit disposed to oppose the substrate,
wherein the supporter pin comprises:
a housing in which a groove is formed;
a ball accommodated in the groove to support the substrate; and
a retainer accommodated in the housing and preventing separation of the ball,
wherein the housing provides a space for the retainer to move along with the ball, such that the retainer moves upward and to one side in the space when the ball moves to the one side of the groove,
wherein the ball directly contacts a bottom surface of the groove.

14. The heat treatment apparatus of claim 13, wherein the space provided by the housing has a width greater than a width of the retainer and a height greater than a height of the retainer such that the retainer can move within the space.

* * * * *